(12) United States Patent
Wan et al.

(10) Patent No.: US 10,903,290 B2
(45) Date of Patent: Jan. 26, 2021

(54) DISPLAY DEVICE AND DISPLAY APPARATUS CONTAINING SAME

(71) Applicants: Hefei Xinsheng Optoelectronics Technology Co., Ltd., Hefei (CN); BOE TECHNOLOGY GROUP CO., LTD., Beijing (CN)

(72) Inventors: Xiang Wan, Beijing (CN); Wenbin Jia, Beijing (CN)

(73) Assignees: Hefei Xinsheng Optoelectronics Technology Co., Ltd., Hefei (CN); BOE TECHNOLOGY GROUP CO.. LTD., Beijing (CN)

( * ) Notice: Subject to any disclaimer, the term of this patent is extended or adjusted under 35 U.S.C. 154(b) by 0 days.

(21) Appl. No.: 16/319,240

(22) PCT Filed: Jun. 5, 2018

(86) PCT No.: PCT/CN2018/089895
§ 371 (c)(1),
(2) Date: Jun. 17, 2019

(87) PCT Pub. No.: WO2018/233482
PCT Pub. Date: Dec. 27, 2018

(65) Prior Publication Data
US 2019/0229165 A1  Jul. 25, 2019

(30) Foreign Application Priority Data

Jun. 19, 2017  (CN) .......................... 2017 1 0463297

(51) Int. Cl.
*H01L 51/50*   (2006.01)
*H01L 27/32*   (2006.01)
(Continued)

(52) U.S. Cl.
CPC ...... *H01L 27/3246* (2013.01); *H01L 51/5096* (2013.01); *H01L 51/5253* (2013.01);
(Continued)

(58) Field of Classification Search
CPC ..... H01L 27/32; H01L 27/3246; H01L 51/00; H01L 51/004; H01L 51/0046;
(Continued)

(56) References Cited

U.S. PATENT DOCUMENTS 8,981,359 B2 * 3/2015 Kum .................. H01L 27/3258
257/40
9,246,012 B2   1/2016 Yamakita et al.
(Continued)

FOREIGN PATENT DOCUMENTS

CN   103887440 A   6/2014
CN   103972267 A   8/2014
(Continued)

OTHER PUBLICATIONS

Chinese Office Action dated Apr. 15, 2019, from application No. 201710463297.9.
(Continued)

*Primary Examiner* — Monica D Harrison
(74) *Attorney, Agent, or Firm* — Thomas | Horstemeyer, LLP

(57) ABSTRACT

The present disclosure provides a display device. The display device including a substrate, a planarization layer formed on the substrate, a transparent electrode formed on the planarization layer, and a pixel defining layer formed on the transparent electrode. The pixel defining layer is configured to define a display area for each pixel and having an opening corresponding to the display area. The display device further includes a light emitting layer formed on the pixel defining layer, a metal electrode formed on the light
(Continued)

emitting layer, and a hydrogen-atom blocking material layer formed on the metal electrode.

11 Claims, 2 Drawing Sheets

(51) Int. Cl.
   *H01L 51/52* (2006.01)
   *H01L 51/00* (2006.01)

(52) U.S. Cl.
   CPC .... *H01L 51/0046* (2013.01); *H01L 2251/308* (2013.01); *H01L 2251/533* (2013.01); *H01L 2251/5369* (2013.01)

(58) Field of Classification Search
   CPC ... H01L 51/50; H01L 51/509; H01L 51/5096; H01L 51/52; H01L 51/525; H01L 51/5253
   USPC .......................................................... 257/40
   See application file for complete search history.

(56) References Cited

U.S. PATENT DOCUMENTS

| | | | |
|---|---|---|---|
| 9,911,794 | B2 | 3/2018 | Jiao |
| 2012/0025224 | A1* | 2/2012 | Yuasa ................. H01L 27/3246 257/89 |
| 2014/0175394 | A1 | 6/2014 | Kum et al. |
| 2014/0191203 | A1 | 7/2014 | Son et al. |
| 2015/0014663 | A1 | 1/2015 | Kwak et al. |
| 2015/0048361 | A1 | 2/2015 | Yamakita et al. |
| 2016/0020263 | A1 | 1/2016 | Xu et al. |
| 2016/0260785 | A1 | 9/2016 | Jiao |

FOREIGN PATENT DOCUMENTS

| | | |
|---|---|---|
| CN | 104377306 A | 2/2015 |
| CN | 106597748 A | 4/2017 |
| CN | 107170790 A | 9/2017 |
| KR | 20150007991 A | 1/2015 |
| KR | 101588298 B1 | 2/2016 |

OTHER PUBLICATIONS

International Search Report and Written Opinion dated Sep. 6, 2018, from application No. PCT/CN2018/089895.
3rd Office Action dated Jun. 17, 2020 for Chinese Patent Application No. 201710463297.9.

* cited by examiner

DISPLAY DEVICE AND DISPLAY APPARATUS CONTAINING SAME

CROSS REFERENCE

The present disclosure is based on International Application No. PCT/CN2018/089895, filed on Jun. 5, 2018, which is based upon and claims priority to Chinese Patent Application No. 201710463297.9, filed on Jun. 19, 2017, the entire contents thereof are incorporated herein by reference.

TECHNICAL FIELD

The present disclosure relates to the technical field of display, and in particular, to a display device and a display apparatus.

BACKGROUND

OLED (Organic Light-Emitting Diode) is a display lighting technology that has been developed in recent years. Especially in the display industry, OLED has become one of the hotspots in the field of flat panel display research. Compared with a liquid crystal display, OLED has advantages of high response, high contrast, being able to be flexible, low power consumption, low production cost, self-illumination, wide viewing angle and fast response. At present, OLEDs in mobile phones, PDAs, digital cameras and other display fields have begun to replace traditional LCD screens. OLEDs are considered to have broad application prospects and have important research significance. Based on light emitting directions of OLED devices, OLED devices can be divided into a bottom-emitting OLED device and a top-emitting OLED device.

There are still many optical problems existing in OLED displays, including the problem of white spots on the displays. According to analysis, one of the causes of white spots is that H atoms generated during CVD (chemical vapor deposition) may react with TFT channel material indium gallium zinc oxide (IGZO) after penetrate through a path such as particles and thus generate OH$^-$ ions, while the generation of OH$^-$ ions may cause increased mobility of the channel, further causing the threshold voltages $V_{th}$ of a part of the TFTs to drift negatively, and resulting in increased current, local brightening and white spots.

The above information disclosed in this Background section is for enhancement of understanding of the background of the present disclosure, and thus it may include information that does not constitute the prior art known to those of ordinary skill in the art.

SUMMARY

The present disclosure provides a display device that overcomes at least some of the problems due to limitations and disadvantages of the related art.

Other features and improvements of the present disclosure will be apparent from the following detailed description, or may be partly learned from practice of the present disclosure.

According to an exemplary arrangement of the present disclosure, there is disclosed a display device. The display device includes a substrate, a planarization layer, a transparent electrode formed on the planarization layer, and a pixel defining layer formed on the transparent electrode. The pixel defining layer is configured to define a display area for each pixel and having an opening corresponding to the display area. The display device further includes a light emitting layer formed on the pixel defining layer, a metal electrode formed on the light emitting layer, and a hydrogen-atom blocking material layer formed on the metal electrode.

In an exemplary arrangement of the present disclosure, the hydrogen-atom blocking material layer is an indium zinc oxide layer.

In an exemplary arrangement of the present disclosure, the indium zinc oxide layer has a thickness of about 50 angstroms to about 500 angstroms.

In an exemplary arrangement of the present disclosure, the pixel defining layer includes a hydrogen-atom blocking material.

In an exemplary arrangement of the present disclosure, the planarization layer includes a hydrogen-atom blocking material.

In an exemplary arrangement of the present disclosure, the hydrogen-atom blocking material includes a nano indium zinc oxide and/or a $C_{60}$ material.

In an exemplary arrangement of the present disclosure, the display device further includes a thin film transistor formed on the hydrogen-atom blocking material layer.

In an exemplary arrangement of the present disclosure, the display device is of a bottom emission type.

In an exemplary arrangement of the present disclosure, the light emitting layer is an organic light emitting layer.

According to an exemplary arrangement of the present disclosure, there is disclosed a display device. The display device includes a substrate, a planarization layer formed on the substrate, a transparent electrode formed on the planarization layer, and a pixel defining layer formed on the transparent electrode. The pixel defining layer is configured to define a display area for each pixel and having an opening corresponding to the display area. The display device further includes a light emitting layer formed on the pixel defining layer, and a metal electrode formed on the light emitting layer. The pixel defining layer and/or the planarization layer includes a hydrogen-atom blocking material.

In an exemplary arrangement of the present disclosure, the hydrogen-atom blocking material is a nano indium zinc oxide material and/or a $C_{60}$ material.

In an exemplary arrangement of the present disclosure, the display device is of a bottom emission type.

In an exemplary arrangement of the present disclosure, the light emitting layer is an organic light emitting layer.

According to an exemplary arrangement of the present disclosure, there is disclosed a display apparatus including any of the display device described above.

It should be understood that both the foregoing general description and the following detailed description are exemplary and explanatory only and are not restrictive of the disclosure.

BRIEF DESCRIPTION OF THE DRAWINGS

The above and other objects, features and advantages of the present disclosure will become more apparent from detailed description of exemplary arrangements with reference to accompanying drawings.

The accompanying drawings, which are incorporated in and constitute a part of this specification, illustrate arrangements consistent with the disclosure and, together with the description, serve to explain the principles of the disclosure. Apparently, the accompanying drawings in the following description only illustrate some of the arrangements of the present disclosure, and other drawings may be obtained from these drawings by those skilled in the art without paying any creative effort.

DETAILED DESCRIPTION

Figure 1:
FIG. 1 illustrates a schematic diagram of a display device according to an exemplary arrangement of the present disclosure.

Exemplary arrangements will now be described more fully with reference to the accompanying drawings. However, the exemplary arrangements can be embodied in a variety of forms, and should not be construed as being limited to the examples set forth herein; the described features, structures, or characteristics may be combined in any suitable manner in one or more arrangements. In the following description, numerous specific details are set forth for thorough understanding of the arrangements of the present disclosure. However, one skilled in the art will appreciate that one or more of the specific details may be omitted, or other methods, components, devices, steps, etc. may be employed.

It should be pointed out that in the drawings, the dimensions of layers and areas may be exaggerated for clarity of illustration. It should also be understood that when an element or a layer is referred to as "on" another element or layer, it may be directly on the other element or an intermediate layer may be present. In addition, it can be understood that when an element or a layer is referred to as being "under" another element or layer, it may be directly under the other element or more than one intermediate layer or element may exist. In addition, it can also be understood that when a layer or an element is referred to as being "between" two layers or two elements, it can be the only one layer between the two layers or the two elements, or more than one intermediate layer or element may exist. Like reference numerals indicate like elements throughout the present disclosure.

An arrangement of the present disclosure is to provide a display device including: a substrate; a planarization layer formed on the substrate; a transparent electrode formed on the planarization layer; a pixel defining layer formed on the transparent electrode, the pixel defining layer being configured to define a display area for each pixel and having an opening corresponding to the display area; a light emitting layer formed on the pixel defining layer; a metal electrode formed on the light emitting layer; and a hydrogen-atom blocking material layer formed on the metal electrode.

Another object of the present disclosure is to provide a display device including: a substrate; a planarization layer formed on the substrate; a transparent electrode formed on the planarization layer; a pixel defining layer formed on the transparent electrode, the pixel defining layer being configured to define a display area for each pixel and having an opening corresponding to the display area; a light emitting layer formed on the pixel defining layer; and a metal electrode formed on the light emitting layer, wherein the pixel defining layer and/or the planarization layer includes a hydrogen-atom blocking material.

By depositing a hydrogen-atom blocking material layer on the metal electrode, the holes generated in the metal cathode film can be decreased, the path for subsequent hydrogen atoms to penetrate into the TFT can be blocked, and the increase in mobility of the channel due to the generation of $OH^-$ ions can be mitigated. Thus, it can reduce the appearance of white spots and improve the optical quality of the display device. In addition or alternatively, by adding a hydrogen-atom blocking material such as a nano indium zinc oxide material and/or a $C_{60}$ material in the pixel defining layer, it can further mitigate the increase in the mobility of the channel due to generation of $OH^-$ ions, thus reducing white spots and improving the optical quality of display devices. In addition or alternatively, by adding a hydrogen-atom blocking material such as a nano indium zinc oxide material and/or a $C_{60}$ material to a planarization layer formed between the substrate and the transparent electrode, it can form an omnidirectional, multi-layer hydrogen-atom blocking system, and thus further mitigate the increase in the mobility of the channel due to generation of $OH^-$ ions.

Figure 2:
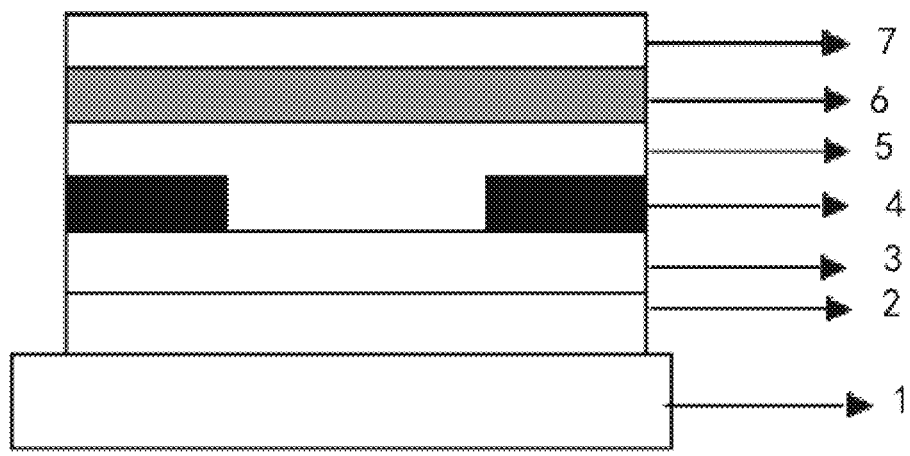
FIG. 2 illustrates a schematic diagram of a display device according to another exemplary arrangement of the present disclosure.

The display device of the present disclosure will be specifically described below with reference to the accompanying drawings, of which FIG. 1 illustrates a schematic diagram of a display device according to an exemplary arrangement of the present disclosure; and FIG. 2 illustrates a schematic diagram of a display device according to another exemplary arrangement of the present disclosure.

FIG. 1 illustrates a schematic diagram of a display device according to an exemplary arrangement of the present disclosure.

As shown in FIG. 1, the display device includes: a substrate 1; a planarization layer 2 formed on the substrate 1; a transparent electrode 3 formed on the planarization layer 2; a pixel defining layer 4 formed on the transparent electrode 3, the pixel defining layer 4 being configured to define a display area for each pixel and having an opening corresponding to the display area; a light emitting layer 5 formed on the pixel defining layer 4; a metal electrode 6 formed on the light emitting layer 5; and a hydrogen-atom blocking material layer 7 formed on the metal electrode 6. By depositing a hydrogen-atom blocking material layer on the metal electrode, the holes generated in the metal cathode 6 film can be reduced, the path for subsequent hydrogen atoms to penetrate into the TFT can be blocked, and the increase in mobility of the channel due to the generation of $OH^-$ ions can be mitigated. Thus, it can reduce the appearance of white spots and improve the optical quality of the display device.

The substrate 1 is generally a transparent glass substrate, or otherwise an inorganic transparent substrate, or may be an organic polymer transparent substrate. The transparent electrode 3 is generally an indium tin oxide or ITO anode. The metal electrode 6 is a cathode, generally an aluminum electrode, or a silver electrode, etc.

The hydrogen-atom blocking material layer 7 may be an indium oxide zinc (IZO) layer or other oxide layer. The hydrogen-atom blocking material layer may be formed in the following manner. Specifically, after a metal Al electrode is formed, before the chemical vapor deposition (CVD), an oxide film such as an indium oxide zinc (IZO) film with a thickness of 50-500 angstroms is deposited by sputtering.

The holes which may be generated in the cathode Al film can be decreased by depositing an indium oxide zinc (IZO) film or other oxide layer, to block a path for subsequent hydrogen atoms to penetrate into the TFT.

The indium oxide zinc (IZO) or other oxide can also react with a passing hydrogen atom to form an $OH^-$ ion, thus preventing hydrogen atoms from penetrating into the TFT.

Accordingly, the negative drift of the threshold voltage $V_{th}$ of the TFT can be mitigated, the white spot condition of the display can be mitigated, and the optical quality of the display can be improved.

In order to further block the path of subsequent hydrogen atoms permeating into the TFT, and further mitigate the increase in mobility of the channel due to the generation of OH⁻ ions, in yet another exemplary arrangement of the present disclosure, by adding hydrogen-atom blocking material such as a nano indium zinc oxide material and/or a $C_{60}$ material in the pixel defining layer, it can further reduce white spots and improve the optical quality of display device.

Specifically, when preparing a pixel defining layer (PDL) 4, a certain proportion (1 wt % to 10 wt %) of indium oxide zinc (IZO) or other oxide such as oxide nano material and/or $C_{60}$ material is mixed into the pixel defining layer (PDL) 4.

The indium zinc oxide (IZO) or other oxide such as oxide nano material can react with the penetrating hydrogen atoms to form OH⁻ ions.

The $C_{60}$ material can absorb hydrogen atoms (since the C=C double bonds present in $C_{60}$ can absorb H atoms) and prevent hydrogen atoms from penetrating into the TFT.

Accordingly, the negative drift of the threshold voltage $V_{th}$ of the TFT can be further mitigated, the white spot condition of the display can be mitigated, and the optical quality of the display can be improved.

In order to form an omnidirectional, multi-layered hydrogen-atom blocking system, to block the path of subsequent hydrogen atoms from penetrating into the TFT as much as possible, and to mitigate the increase in the mobility of the channel due to the generation of OH⁻ ions as much as possible, in another exemplary arrangement of the present disclosure, a hydrogen-atom blocking material, such as nano indium zinc oxide material and/or $C_{60}$ material, may be additionally added to the planarization layer 2 formed between the substrate and the transparent electrode. It can mitigate the white spot condition of the display and improve the optical quality of the display as much as possible.

In an exemplary arrangement of the present disclosure, the display device further includes a TFT layer 8 formed on the hydrogen-atom blocking material layer 7.

Referring to FIG. 2, the display device in another exemplary arrangement includes: a substrate 1; a planarization layer 2 formed on the substrate; a transparent electrode 3 formed on the planarization layer 2; a pixel defining layer 4 formed on the transparent electrode, the pixel defining layer 4 being configured to define a display area for each pixel and having an opening corresponding to the display area; a light emitting layer 5 formed on the pixel defining layer 4; a metal electrode 6 formed on the light emitting layer 5; and a hydrogen-atom blocking material layer 7 formed on the metal electrode 6. The hydrogen-atom blocking material such as a nano indium zinc oxide material and/or a $C_{60}$ material may be added to the planarization layer 2 specifically by a manner in the following arrangement.

In the preparation of the planarization layer 2, a certain proportion (1 wt % to 10 wt %) of indium oxide zinc (IZO) or other oxide such as oxide nano material and/or $C_{60}$ material is mixed into the resin.

In order to further block the path of subsequent hydrogen atoms permeating into the TFT, when preparing a pixel defining layer 4, a certain proportion (1 wt % to 10 wt %) of indium oxide zinc or other oxide such as oxide nano material and/or $C_{60}$ material is mixed into the pixel defining layer 4.

The indium zinc oxide (IZO) or other oxide can react with the penetrating hydrogen atoms to form OH⁻ ions.

The $C_{60}$ material can absorb hydrogen atoms (since the C=C double bonds present in $C_{60}$ can absorb H atoms) and prevent hydrogen atoms from penetrating into the TFT.

Accordingly, the omnidirectional and multi-layer hydrogen-atom blocking system constructed by combining the above three arrangements can mitigate the negative drift of the threshold voltage $V_{th}$ of the TFT as much as possible, and mitigate the white spot condition of the display and improve the optical quality of the display as much as possible.

In an exemplary arrangement of the present disclosure, the display device is of a bottom emission type.

In an exemplary arrangement of the present disclosure, the light emitting layer is an organic light emitting layer.

In summary, according to some arrangements of the present disclosure, by depositing a hydrogen-atom blocking material layer on the metal electrode, the holes generated in the metal cathode film can be decreased, the path for subsequent hydrogen atoms to penetrate into the TFT can be blocked, and the increase in mobility of the channel due to the generation of OH⁻ ions can be mitigated. Thus, it can reduce the appearance of white spots and improve the optical quality of the display device.

According to some arrangements of the present disclosure, by adding a hydrogen-atom blocking material such as a nano indium zinc oxide material and/or a $C_{60}$ material in the pixel defining layer, it can further mitigate the increase in the mobility of the channel due to generation of OH⁻ ions, thus reducing white spots and improving the optical quality of display devices.

According to some arrangements of the present disclosure, by adding a hydrogen-atom blocking material such as a nano indium zinc oxide material and/or a $C_{60}$ material to a planarization layer formed between the substrate and the transparent electrode, it can form an omnidirectional, multi-layer hydrogen-atom blocking system, and thus further mitigate the increase in the mobility of the channel due to generation of OH⁻ ions.

Other arrangements of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:
1. A display device, comprising:
 a substrate;
 a planarization layer;
 a transparent electrode formed on the planarization layer;
 a pixel defining layer formed on the transparent electrode, the pixel defining layer configured to define a display area for each of a plurality of pixels and having an opening corresponding to the display area;
 a light emitting layer formed on the pixel defining layer;
 a metal electrode formed on the light emitting layer; and
 a hydrogen-atom blocking material layer formed on the metal electrode, wherein the hydrogen-atom blocking material layer comprises a $C_{60}$ material.

2. The display device according to claim 1, wherein the hydrogen-atom blocking material layer has a thickness of about 50 angstroms to about 500 angstroms.

3. The display device according to claim 1, wherein the pixel defining layer comprises a hydrogen-atom blocking material.

4. The display device according to claim 1, wherein the planarization layer comprises a hydrogen-atom blocking material.

5. The display device according to claim 1, further comprising a thin film transistor formed on the hydrogen-atom blocking material layer.

6. The display device according to claim 1, wherein the display device is of a bottom emission type.

7. The display device according to claim 1, wherein the light emitting layer is an organic light emitting layer.

8. A display device comprising:
a substrate;
a planarization layer formed on the substrate;
a transparent electrode formed on the planarization layer;
a pixel defining layer formed on the transparent electrode, the pixel defining layer being configured to define a display area for each pixel and having an opening corresponding to the display area;
a light emitting layer formed on the pixel defining layer; and
a metal electrode formed on the light emitting layer;
wherein at least one of the pixel defining layer and the planarization layer comprises a hydrogen-atom blocking material, wherein the hydrogen-atom blocking material comprises at least one of a nano indium zinc oxide material and a $C_{60}$ material.

9. The display device according to claim 8, wherein the display device is of a bottom emission type.

10. The display device according to claim 8, wherein the light emitting layer is an organic light emitting layer.

11. A display apparatus, comprising:
a display device, comprising:
a substrate;
a planarization layer;
a transparent electrode formed on the planarization layer;
a pixel defining layer formed on the transparent electrode, the pixel defining layer configured to define a display area for each of a plurality of pixels and having an opening corresponding to the display area;
a light emitting layer formed on the pixel defining layer;
a metal electrode formed on the light emitting layer; and
a hydrogen-atom blocking material layer formed on the metal electrode, wherein the hydrogen-atom blocking material layer comprises a $C_{60}$ material.

* * * * *